United States Patent
Yoon et al.

(10) Patent No.: US 11,081,646 B2
(45) Date of Patent: Aug. 3, 2021

(54) COATING COMPOSITION, METHOD FOR PRODUCING ORGANIC ELECTROLUMINESCENT DEVICE USING SAME, AND ORGANIC ELECTROLUMINESCENT DEVICE PRODUCED THEREBY

(71) Applicant: LG Chem, Ltd., Seoul (KR)

(72) Inventors: Seokhee Yoon, Daejeon (KR); Jaechol Lee, Daejeon (KR); Jinseck Kim, Daejeon (KR); Donggu Lee, Daejeon (KR); Hwakyung Kim, Daejeon (KR); Jae Hak Jeong, Daejeon (KR); Jiyeon Shin, Daejeon (KR); Daeho Kim, Daejeon (KR)

(73) Assignee: LG Chem, Ltd.

( * ) Notice: Subject to any disclaimer, the term of this patent is extended or adjusted under 35 U.S.C. 154(b) by 355 days.

(21) Appl. No.: 16/328,466

(22) PCT Filed: Nov. 7, 2017

(86) PCT No.: PCT/KR2017/012520
§ 371 (c)(1),
(2) Date: Feb. 26, 2019

(87) PCT Pub. No.: WO2018/084681
PCT Pub. Date: May 11, 2018

(65) Prior Publication Data
US 2020/0127202 A1    Apr. 23, 2020

(30) Foreign Application Priority Data

Nov. 7, 2016  (KR) .................. 10-2016-0147558

(51) Int. Cl.
*H01L 51/50*    (2006.01)
*H01L 51/00*    (2006.01)
(Continued)

(52) U.S. Cl.
CPC .......... *H01L 51/004* (2013.01); *C09D 129/10* (2013.01); *C09D 171/00* (2013.01);
(Continued)

(58) Field of Classification Search
None
See application file for complete search history.

(56) References Cited

U.S. PATENT DOCUMENTS

2008/0020208 A1   1/2008  Lee et al.
2010/0213446 A1   8/2010  Zhang et al.
(Continued)

FOREIGN PATENT DOCUMENTS

EP    2461389 A1    6/2012
EP    3073494 A1    9/2016
(Continued)

OTHER PUBLICATIONS

Extended European Search Report including Written Opinion for Application No. EP17867210.1 dated Jul. 19, 2019.
(Continued)

*Primary Examiner* — Gregory D Clark
(74) *Attorney, Agent, or Firm* — Lerner, David, Littenberg, Krumholz & Mentlik, LLP (57) ABSTRACT

The present specification relates to a hole injection or transfer layer coating composition of an organic light emitting diode comprising an organic metal complex of a transition metal; a fluorine-based polymer comprising sulfonic acid or sulfonate; and an organic solvent, a method for manufacturing an organic light emitting diode and an organic light emitting diode using the same.

20 Claims, 1 Drawing Sheet

(51) Int. Cl.
*C09D 129/10* (2006.01)
*C09D 171/00* (2006.01)

(52) U.S. Cl.
CPC ...... *H01L 51/0035* (2013.01); *H01L 51/0043* (2013.01); *H01L 51/0003* (2013.01); *H01L 51/0005* (2013.01); *H01L 51/5056* (2013.01); *H01L 51/5088* (2013.01)

(56) References Cited

U.S. PATENT DOCUMENTS

| | | |
|---|---|---|
| 2011/0253946 A1 | 10/2011 | Huh et al. |
| 2012/0119200 A1 | 5/2012 | Ueno et al. |
| 2012/0138916 A1* | 6/2012 | Ueno ............... H01L 51/0084 257/40 |
| 2012/0146010 A1 | 6/2012 | Ueno et al. |
| 2012/0175596 A1 | 7/2012 | Faircloth et al. |
| 2013/0263925 A1 | 10/2013 | Gaudiana et al. |
| 2015/0282311 A1 | 10/2015 | Lovenich et al. |
| 2016/0020420 A1* | 1/2016 | Lee .................. H01L 51/442 136/256 |
| 2016/0035995 A1 | 2/2016 | Lee et al. |

FOREIGN PATENT DOCUMENTS

| | | |
|---|---|---|
| JP | 2006152251 A | 6/2006 |
| JP | 2010021422 A | 1/2010 |
| JP | 2011049545 A | 3/2011 |
| JP | 2011173788 A | 9/2011 |
| JP | 2012514064 A | 6/2012 |
| JP | 2012520381 A | 9/2012 |
| KR | 20070117199 A | 12/2007 |
| KR | 20120100893 A | 9/2012 |
| KR | 101397256 B1 | 5/2014 |
| KR | 20140108483 A | 9/2014 |
| KR | 20150005573 A | 1/2015 |
| KR | 20150074171 A | 7/2015 |
| KR | 20160015498 A | 2/2016 |
| WO | 2010105140 A2 | 9/2010 |

OTHER PUBLICATIONS

Weiming Qiu et al: "Nafion-Modified MoOx as Effective Room-Temperature Hole Injection Layer for Stable, High-Performance Inverted Organic Solar Cells", ACS Applied Materials & Interfaces, vol. 7, No. 6, Feb. 5, 2015 (Feb. 5, 2015), pp. 3581-3589, XP055604351.
International Search Report for PCT/KR2017012520 dated Mar. 26, 2018.

* cited by examiner

COATING COMPOSITION, METHOD FOR PRODUCING ORGANIC ELECTROLUMINESCENT DEVICE USING SAME, AND ORGANIC ELECTROLUMINESCENT DEVICE PRODUCED THEREBY

CROSS-REFERENCE TO RELATED APPLICATIONS

The present application is a national phase entry under 35 U.S.C. § 371 of International Application No. PCT/KR2017/012520 filed Nov. 7, 2017, which claims priority from Korean Patent Application No. 10-2016-0147558 filed Nov. 7, 2016, all of which are incorporated herein by reference.

TECHNICAL FIELD

The present specification relates to a coating composition, a method for manufacturing an organic light emitting diode and an organic light emitting diode manufactured using the same.

BACKGROUND ART

An organic light emission phenomenon is one of examples converting current to visible light by an internal process of specific organic molecules. A principle of an organic light emission phenomenon is as follows. When an organic material layer is placed between an anode and a cathode and a current is applied between the two electrodes, electrons and holes are injected to the organic material layer from the cathode and the anode, respectively. The holes and the electrons injected to the organic material layer recombine to form excitons, and light emits when these excitons fall back to the ground state. An organic light emitting diode using such a principle may be generally formed with a cathode, an anode, and an organic material layer placed therebetween, for example, an organic material layer including a hole injection layer, a hole transfer layer, a light emitting layer and an electron transfer layer.

When manufacturing an organic light emitting diode using a vacuum process, there are disadvantages in that a burden for high equipment investment costs and process costs is very high, uniformly enlarging the device has limits, and utilization of materials is low since, during deposition, the percentage of being wasted without being deposited on a substrate is high. Meanwhile, when manufacturing an organic light emitting diode using a solution process, there are advantages in that manufacturing costs may be reduced by excluding high-priced deposition equipment, and a large area device is readily manufactured. However, when laminating layers forming an organic light emitting diode through a solution process, lower layers are likely to be damaged by processes of forming upper layers, unlike in the deposition process. In other words, materials of lower layers are dissolved again by solvents or inks used in the solution process causing a phenomenon of mixing with upper layers or physically damaging a thin film. In order to prevent such a phenomenon, solvents used in each layer are employed not to have solubility for each other, or a process of preventing the dissolution of lower layers when forming upper layers through post-treatment for the lower layers may also be added.

In an organic light emitting diode manufactured using such a solution process method, a hole injection layer material that is most often used is a conductive polymer. These do not have high solubility themselves, and normally have an aqueous solution form, and therefore, processability is somewhat guaranteed since the solvent properties are different from organic solvents used in upper layers. In addition, when using these, a relatively low operating voltage is obtained. However, these normally use acidic dopant materials with a low pH and damage electrode materials that are lower layers, and thereby have a disadvantage of declining a life time property. Meanwhile, as another method of forming a hole injection layer, a method of forming by doping an ionic material or an n-type material such as TCNQ to an arylamine-based material is known. However, as described above, this method still has a problem of post process tolerance for solvents or inks.

DISCLOSURE

Technical Problem

The present specification is directed to providing a composition for coating a hole injection or transfer layer capable of being used when manufacturing an organic light emitting diode using a solution process, a method for manufacturing an organic light emitting diode using the same, and an organic light emitting diode manufactured using the same.

Technical Solution

One embodiment of the present specification provides a hole injection or transfer layer coating composition of an organic light emitting diode, the composition including an organic metal complex of a transition metal; a polymer including a unit of the following Chemical Formula 1; and an organic solvent:

[Chemical Formula 1]

in Chemical Formula 1,

A is a substituted or unsubstituted alkylene group, and an aromatic hydrocarbon ring, a heteroring, O, S, C(=O), S(=O) or S(=O)$_2$ may locate instead of at least one of the Cs of the alkylene chain, $X_1$ is O or S, $X_2$ is $CR_5R_6$, O or S, n is an integer of 1 to 10, p is an integer of 1 to 10 and m is an integer of 0 to 10, Y is $SO_3H$, $SO_3Li$, $SO_3Na$, $SO_3K$, $SO_3Rb$ or $SO_3Cs$, and $R_1$ to $R_6$ are each independently hydrogen, fluorine, an alkyl group or a fluoroalkyl group, however, at least one of $R_1$ and $R_2$ is fluorine.

Another embodiment of the present specification provides a method for manufacturing an organic light emitting diode including preparing a substrate; forming a first electrode on the substrate; forming one or more organic material layers on the first electrode; and forming a second electrode on the organic material layer, and further including forming a hole injection or transfer layer between the first electrode and the organic material layer or between the second electrode and the organic material layer through a coating method using the coating composition according to the embodiment described above.

Another embodiment of the present specification provides an organic light emitting diode including a first electrode; a second electrode; and one or more organic material layers provided between the first electrode and the second electrode, and further including a hole injection or transfer layer provided between the first electrode and the organic material layer or between the second electrode and the organic material layer, and formed using the coating composition according to the embodiment described above.

Another embodiment of the present specification provides an organic light emitting diode including a first electrode; a second electrode; and one or more organic material layers provided between the first electrode and the second electrode, and further including a hole injection or transfer layer provided between the first electrode and the organic material layer or between the second electrode and the organic material layer, and including a transition metal oxide and a polymer including the unit of Chemical Formula 1.

Advantageous Effects

In the present specification, an organic polymer having both sulfonic acid or sulfonate and a fluorine group is used together with an organic metal complex of a transition metal in order to form a hole injection or transfer layer of an organic light emitting diode. The sulfonic acid has an oxidizing power and is thereby used as an oxidizer. Accordingly, by the sulfonic acid, an organic material ligand of the organic metal complex is readily removed even under inert atmosphere such as nitrogen and is smoothly converted to a metal oxide, and by the organic polymer, coatability is improved and an interface with an upper layer is improved capable of forming a more stable hole injection or transfer layer, and as a result, a long lifetime of a device can be accomplished. In addition, by the transition metal oxide such as $MoO_3$ maintaining high work function with the organic polymer having sulfonic acid or sulfonate and a fluorine group, a smooth injection property of holes is maintained, and a long lifetime of a device can be obtained without a voltage increase and an efficiency decrease.

101: Substrate
201: Anode
301: Hole Injection Layer
401: Hole Transfer Layer
501: Light Emitting Layer
601: Electron Transfer Layer
701: Cathode

MODE FOR DISCLOSURE

Hereinafter, the present specification will be described in detail.

In the present specification, a description of a certain member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

In the present specification, "*" means a bonding position.

One embodiment of the present specification provides a hole injection or transfer layer coating composition of an organic light emitting diode including an organic metal complex of a transition metal; a polymer including a unit of the following Chemical Formula 1; and an organic solvent.

[Chemical Formula 1]

In Chemical Formula 1,

A is a substituted or unsubstituted alkylene group, and an aromatic hydrocarbon ring, a heteroring, O, S, C(=O), S(=O) or S(=O)$_2$ may locate instead of at least one of the Cs of the alkylene chain, $X_1$ is O or S, $X_2$ is $CR_5R_6$, O or S, n is an integer of 1 to 10, p is an integer of 1 to 10 and m is an integer of 0 to 10, Y is $SO_3H$, $SO_3Li$, $SO_3Na$, $SO_3K$, $SO_3Rb$ or $SO_3Cs$, and $R_1$ to $R_6$ are each independently hydrogen, fluorine, an alkyl group or a fluoroalkyl group, however, at least one of $R_1$ and $R_2$ is fluorine.

According to one embodiment, in the organic metal complex of a transition metal, the transition metal is a transition metal of group 3 to group 11.

According to one embodiment, in the organic metal complex of a transition metal, the transition metal is Mo, W, V, Re, Mn or Rh.

According to another embodiment, the content of the organic metal complex of a transition metal in the coating composition is preferably from 0.01% by weight to 50% by weight. In addition, the organic metal complex of a transition metal in the coating composition is preferably present in a content of 10% or greater based on the content of the fluorine-based polymer including sulfonic acid or sulfonate. When using only the fluorine-based polymer including sulfonic acid or sulfonate, a driving voltage increases much failing to perform a role as a hole injection or transfer layer, however, when including the organic metal complex of a transition metal, a long lifetime of a device is identified at a low driving voltage.

In the embodiment, the organic metal complex may be a complex having an oxidation number of −2 to +6. The organic metal complex includes an organic ligand bonding to the metal described above. The organic ligand is not particularly limited, but may be selected considering solvent solubility, an interfacial property with an adjacent organic material layer, or the like. Examples of the organic ligand may include carbonyl, an acetyl group, an acetylacetonate group, a methyl acetoacetate group, an ethyl acetoacetate group, thioacetate, isocyanate, cyanate, isocyanate, a halogen atom and the like. In addition, the organic ligand may have a structure including an aromatic ring and/or a heteroring, and examples thereof may include benzene, triphenylamine, fluorene, biphenyl, pyrene, anthracene, carbazole, phenylpyridine, trithiophene, phenyloxadiazole, phenyltriazole, benzimidazole, phenyltriazine, benzodithiazine, phenyl quinoxaline, phenylene vinylene, phenylsilole or combinations of these structures. The aromatic ring or the heteroring may have a substituent, and for example, the substituent may be an alkyl group, a halogen atom, an alkoxy group, a cyano group, a nitro group and the like. The alkyl group and the alkoxy group may have, for example, 1 to 12 carbon atoms.

Specifically, examples of the organic ligand may include alkoxy or acetate series such as acetylacetonate (acac), ethyl acetoacetate, methyl acetoacetate, OPh, carbonyl, methoxy, ethoxy, propoxy, isopropoxy, butoxy, sec-butoxy, tert-butoxy, pentoxy, hexyloxy, heptyloxy, octyloxy or ethylhexyloxy, but are not limited thereto. In addition, ligands having a form of these and a halogen group being present together may be included. The organic metal complex may have a form of bonding two or more different ligands.

Examples of the organic metal complex may include $W(CO)_6$, $Mo(CO)_6$, $WO_2Cl_2$, $MoO_2(acac)_2$, $VO(acac)_2$, $V(acac)_3$, $W(acac)_3$, $WO_2(acac)_2$, $MoO_2Cl_2$, $ReCl(CO)_5$ and the like.

In one embodiment, the polymer including the unit of Chemical Formula 1 preferably has a weight average molecular weight of 2,000 or greater.

In one embodiment of the present specification, A is a substituted or unsubstituted linear or branched alkylene group, and an aromatic hydrocarbon ring, a heteroring, O, S, $C(=O)$, $S(=O)$ or $S(=O)_2$ may locate instead of at least one of the Cs of the alkylene chain.

According to another embodiment, A is a linear or branched alkylene group unsubstituted or substituted with a halogen group, and an aromatic hydrocarbon ring having 6 to 60 carbon atoms, a heteroring having 2 to 60 carbon atoms, O, S, $C(=O)$, $S(=O)$ or $S(=O)_2$ may locate instead of at least one of the Cs of the alkylene chain.

According to another embodiment, A is a linear or branched alkylene group unsubstituted or substituted with a halogen group, and an aromatic hydrocarbon ring having 6 to 30 carbon atoms, a heteroring having 2 to 30 carbon atoms, O, S, $C(=O)$, $S(=O)$ or $S(=O)_2$ may locate instead of at least one of the Cs of the alkylene chain.

According to another embodiment, A is a linear or branched alkylene group unsubstituted or substituted with fluorine, and an aromatic hydrocarbon ring having 6 to 30 carbon atoms, a heteroring having 2 to 30 carbon atoms, O, S, $C(=O)$, $S(=O)$ or $S(=O)_2$ may locate instead of at least one of the Cs of the alkylene chain.

In another embodiment, A is a linear or branched alkylene group unsubstituted or substituted with fluorine, and an aromatic hydrocarbon ring having 6 to 30 carbon atoms, O or $C(=O)$ may locate instead of at least one of the Cs of the alkylene chain.

In another embodiment, A is a linear or branched alkylene group unsubstituted or substituted with fluorine, and benzene, O or $C(=O)$ may locate instead of at least one of the Cs of the alkylene chain.

In one embodiment of the present disclosure, when benzene locates instead of at least one of the Cs of the alkylene chain of A, the bonding is in the form of a divalent phenyl group, the bonding is in the form of —O— when O locates, and the bonding is in the form of —$C(=O)$— when $C(=O)$ locates.

According to another embodiment, at least one carbon forming the alkylene group is substituted with fluorine in A. According to another embodiment, Chemical Formula 1 may be represented by the following Chemical Formula 1-1 or 1-2.

[Chemical Formula 1-1]

[Chemical Formula 1-2]

In Chemical Formulae 1-1 and 1-2, q, r, s and t mean the number of moles in each parenthesis and are an integer of 1 to 500, and the remaining substituents are the same as defined in Chemical Formula 1.

According to one embodiment, in Chemical Formulae 1, 1-1 and 1-2, $R_1$ and $R_2$ are each independently fluorine or a fluoroalkyl group.

According to another embodiment, in Chemical Formulae 1, 1-1 and 1-2, $R_1$ and $R_2$ are each independently fluorine or $CF_3$.

According to another embodiment, in Chemical Formulae 1, 1-1 and 1-2, $X_1$ is O or S.

According to another embodiment, in Chemical Formulae 1, 1-1 and 1-2, $X_2$ is O or $CR_5R_6$.

In another embodiment, in Chemical Formulae 1, 1-1 and 1-2, $R_5$ and $R_6$ are fluorine.

According to another embodiment, in Chemical Formulae 1, 1-1 and 1-2, $X_2$ is O or $CF_2$.

In another embodiment, in Chemical Formulae 1, 1-1 and 1-2, $R_3$ and $R_4$ are each independently fluorine.

According to another embodiment, in Chemical Formulae 1, 1-1 and 1-2, n and p are 2, m is 0 or 1, and when n and p are each 2, structures in the parentheses are the same as or different from each other.

According to one embodiment, in Chemical Formulae 1, 1-1 and 1-2, Y is $SO_3H$ or $SO_3K$.

The present disclosure relates to a coating composition for forming a hole injection or transfer layer of an organic light emitting diode, and by including an organic metal complex, a fluorine-based polymer including sulfonic acid or sulfonate and an organic solvent, a uniform thin film is formed, and accordingly, a device having low driving voltage, high efficiency and excellent lifetime property may be manufactured. Meanwhile, a method of forming a hole injection and transfer layer by using a coating composition prepared by dispersing nanoparticles such as $MoO_3$ or $WO_3$ having a high work function value may also be considered, however, nanoparticles have a disadvantage in that a phenomenon of particle aggregation frequently occurs during a process of purification after synthesis, and a uniformly and stably-dispersed coating composition is difficult to prepare.

In addition, even when a coating composition including nanoparticles is uniformly dispersed, a phenomenon of particle reaggregation occurs during a drying process after coating, and as a result, a uniform coating film is difficult to obtain. Meanwhile, in order improve dispersibility when using nanoparticles, amine or carboxylic acid having a long chain-type alkyl group with approximately 8 to 20 carbon atoms may be added to prevent particle aggregation, however, in this case, it is identified that a driving voltage of a device increases by the additive such as amine or carboxylic acid functioning as an insulator among the particles.

Meanwhile, in the coating composition of the present disclosure, an organic metal complex; and a fluorine-based polymer including sulfonic acid or sulfonate are completely dissolved in a solvent instead of being present as a dispersion liquid, and therefore, a uniform thin film may be obtained without causing a problem of aggregation when forming a coating film.

In one embodiment, the polymer including the unit of Chemical Formula 1 preferably has a weight average molecular weight of greater than or equal to 2,000 and less than or equal to 2,000,000. When the material has a molecular weight of less than 2,000, thin film formation is unstable when coating, and an effect of improving device properties is small. When the molecular weight is greater than 2,000,000, material viscosity becomes too high causing a problem in that a smooth coating layer is difficult to form.

In one embodiment, the content of the polymer is preferably from 0.01% by weight to 50% by weight with respect to the whole coating composition. The polymer being not included in the coating composition is not preferred in terms of coatability improvement of a thin film and a long lifetime of a device, and the content being greater than 50% by weight is not suited for a coating process forming a thin film for an organic light emitting diode due to an excessively high concentration.

In one embodiment, the organic solvent is not particularly limited, but includes one or more types of ether-based, alcohol-based, ketone-based and ester-based solvents.

In one embodiment, the organic solvent includes an alcohol-based solvent.

In another embodiment, the organic solvent includes an ester-based solvent.

In another embodiment, the organic solvent includes an ether-based solvent.

In another embodiment, the organic solvent includes a ketone-based solvent.

In the present specification, the organic solvent may include one of tetrahydrofuran, acetone, methylethylketone, diethylketone, cyclohexanone, cyclopentanone, isophorone, acetylacetone, tetralone, ethyl benzoate, methyl benzoate, butyl benzoate, ethyl acetate, ethyl acetoacetate, diethyl acetoacetate, methyl benzoate, ethyl benzoate, methanol, ethanol, propanol, isopropanol, butanol, sec-butanol, tert-butanol, pentanol, cyclopentanol, hexanol, cyclohexanol, heptanol and octanol, and may be a solvent represented by the following Chemical Formula 5.

[Chemical Formula 5]

In Chemical Formula 5, n is an integer of 1 to 20, 1 and m are each or simultaneously an integer of 0 to 5, $R_1$, $R_2$, $R_3$ and $R_4$ are each or simultaneously a hydrogen atom, an alkyl group having 1 to 20 carbon atoms, an alkenyl group having 2 to carbon atoms, an alkynyl group having 2 to 20 carbon atoms, an alkoxy group having 1 to 20 carbon atoms, an aryl group having 6 to 40 atoms, a heteroaryl group having 2 to 40 carbon atoms, or an ester group having 1 to 20 carbon atoms.

According to one embodiment, the organic solvent preferably has a boiling point of 350° C. or lower. Specific examples thereof may include ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2 propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600, triethylene glycol or the like.

The solvent expressed by Chemical Formula 5 does not form chemically strong bonds with the organic metal complex used as a transition metal oxide precursor, but prevents the precursor from readily changing into other oxidation states or materials, and therefore, has an advantage of producing an oxide thin film with no organic substances left after manufacturing a device.

The coating composition may further include additives in addition to the organic metal complex in order to improve properties such as coating properties and viscosity. For example, the additive may include any one or more selected from the group consisting of a dispersant, a surfactant, a polymer, a binding agent, a crosslinking binding agent, an emulsifier, an antifoaming agent, a drying agent, a filler, an extender, a thickening agent, a film conditioning agent, an anti-oxidant, a free-flowing agent, a leveling additive and a corrosion inhibitor.

Another embodiment of the present specification relates to a method for manufacturing an organic light emitting diode, and the method includes preparing a substrate; forming a first electrode on the substrate; forming one or more organic material layers on the first electrode; and forming a second electrode on the organic material layer, and further including forming a hole injection or transfer layer between the first electrode and the organic material layer or between the second electrode and the organic material layer through a coating method using the coating composition according to the embodiment described above.

The coating method forming a hole injection or transfer layer may be, for example, any one selected from the group consisting of a spin coating method, an inkjet method, nozzle printing, wet coating, spray coating, doctor blade coating, contact printing, upper feed reverse printing, lower feed reverse printing, nozzle feed reverse printing, gravure printing, microgravure printing, reverse microgravure printing, roll coating, slot die coating, capillary coating, jet deposition and spray deposition, and may be preferably spin coating, inkjet coating, nozzle printing or the like.

The coating may be carried out by coating the composition described above on the first electrode or the second electrode, and drying the result. The drying and heat treatment or heat treatment after drying may be carried out under nitrogen or in the atmosphere, however, carrying out in the atmosphere is advantageous in removing the solvent and the organic material ligand, and is advantageous in converting the organic metal complex to an oxide. In addition, as for the heat treatment, the treatment temperature may vary depending on the organic metal complex used, but may be 150° C. or higher and preferably 200° C. or higher.

According to one embodiment, the hole injection or transfer layer formed using the coating composition has a thickness of 1 nm to 1,000 nm. In a general organic light emitting diode, the whole device thickness needs to be optimized due to a cavity effect, and when optimizing the thickness, the thickness needs to be changed from a few nm to 1 micrometer depending on the upper layer materials. Herein, when capable of varying the charge injection or transfer layer thickness without declining device properties, limits in the upper layer device structure and thickness changes decrease, which is advantageous in providing optimized device properties. The hole injection or transfer layer provided in the present disclosure has almost no voltage increases caused by the thickness.

According to another embodiment, the manufacturing method further includes annealing after forming the hole injection or transfer layer formed using the coating composition. The annealing may be carried out at a temperature of 150° C. to 250° C. In the present disclosure, the annealing aims to remove the organic ligand of the organic metal complex in the annealing process and change to a metal oxide, and therefore, the temperature is preferably a high temperature enough to decompose the ligand of the organic metal complex and the atmosphere is preferably an atmosphere having oxygen in order to change to an oxide.

Mixing the polymer including sulfonic acid or sulfonate and fluorine as in the embodiments described in the present specification provides an advantage of obtaining a device having low driving voltage and long lifetime even when heat treating under nitrogen atmosphere due to an oxidation facilitating function of the sulfonic acid or sulfonate.

In the embodiment, except that the hole injection or transfer layer is formed using the coating composition according to the embodiment described above, materials and preparation methods of other electrodes and organic material layers may use those known in the art.

According to one embodiment, the first electrode is an anode and the second electrode is a cathode.

According to another embodiment, the second electrode is an anode, and the first electrode is a cathode.

According to one embodiment, the organic material layer includes a light emitting layer.

According to another embodiment, the organic material layer may be formed in a multilayer structure, and for example, may include a light emitting layer and at least one layer of a hole injection layer, a hole transfer layer. an electron transfer layer, an electron injection layer, an electron blocking layer and a hole blocking layer. For example, a structure of an organic light emitting diode according to one embodiment of the present specification is illustrated in FIG. 1.

Figure 1:
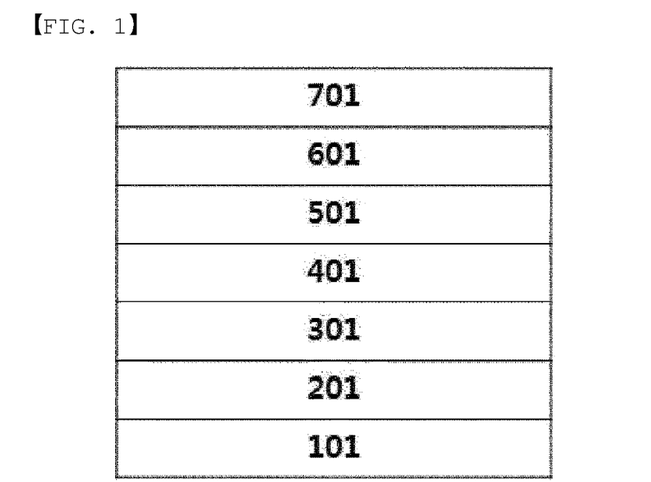
FIG. 1 illustrates an organic light emitting diode according to one embodiment of the present specification.

FIG. 1 illustrates a structure of an organic light emitting diode in which an anode (201), a hole injection layer (301), a hole transfer layer (401), a light emitting layer (501), an electron transfer layer (601) and a cathode (701) are consecutively laminated on a substrate (101). In FIG. 1, the hole injection layer (301) may be formed using the coating composition described above. However, FIG. 1 illustrates an organic light emitting diode, and the organic light emitting diode is not limited thereto.

When the organic light emitting diode includes a plurality of organic material layers, the organic material layers may be formed with materials the same as or different from each other.

For example, the organic light emitting diode of the present specification may be manufactured by consecutively laminating an anode, an organic material layer and a cathode on a substrate. Herein, the organic light emitting diode may be manufactured by forming an anode on a substrate by depositing a metal, a metal oxide having conductivity, or an alloy thereof using a physical vapor deposition (PVD) method such as sputtering or e-beam evaporation, forming an organic material layer including a hole injection layer, a hole transfer layer, a light emitting layer and an electron transfer layer thereon, and then depositing a material capable of being used as a cathode thereon. In addition to such a method, the organic light emitting diode may also be manufactured by consecutively depositing a cathode material, an organic material layer and an anode material on a substrate. Herein, at least one layer or all the layers present between the anode and the cathode may be formed using a solution process. Examples of the solution process may include a printing method such as inkjet printing, nozzle printing, offset printing, transfer printing or screen printing, but are not limited thereto. Using the solution process is economically effective in terms of time and costs when manufacturing the device. When the organic material layer is formed using the solution process, heat treatment or light treatment may be further carried out as necessary. Herein, the heat treatment temperature and time may be selected depending on the process condition or the materials used, and for example, the heat treatment may be carried out for 1 minute to 1 hour at 850° C. to 300° C.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO), indium gallium zinc oxide (IGZO), fluorine-doped tin oxide (FTO) and indium zinc oxide (IZO); combinations of metals and oxides such as $ZnO:Al$ or $SnO_2:Sb$; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as $LiF/Al$ or $LiO_2/Al$, and the like, but are not limited thereto.

When forming an additional hole injection layer in addition to the hole injection or transfer layer formed using the coating composition including the organic metal complex described above, the hole injection layer material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suitable. Specific examples thereof include arylamine-based organic materials, conductive polymers, block copolymers having conjugated parts and non-conjugated parts together, and the like, but are not limited thereto.

The light emitting layer material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxyquinoline aluminum complexes ($Alq_3$); carbazole-based compounds; dimerized styryl compounds; BAlq; 10-hydroxybenzoquinoline-metal compounds; benzoxazole-benzothiazole- and benzimidazole-based compounds; poly(p-phenylenevinylene) (PPV)-based polymers; spiro compounds; polyfluorene, rubrene, and the like, but are not limited thereto.

The light emitting layer may include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, but the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and includes arylamino group-including pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, but the styrylamine compound is not limited thereto. In addition, the metal complex includes iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suitable. Specific examples thereof include Al complexes of 8-hydroxyquinoline; complexes including $Alq_3$; organic radical compounds; hydroxyflavon-metal complexes, and the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)berylium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, but the material is not limited thereto.

Another embodiment of the present specification provides an organic light emitting diode including a first electrode; a second electrode; and one or more organic material layers provided between the first electrode and the second electrode, and further including a hole injection or transfer layer provided between the first electrode and the organic material layer or between the second electrode and the organic material layer, and formed using the coating composition according to the embodiments described above.

The hole injection or transfer layer formed using the coating composition includes a transition metal oxide and a polymer including the unit of Chemical Formula 1 described above. By including a fluorine-based polymer including sulfonic acid or sulfonate as above, stability and uniformity of a coating film of a low molecular weight transition metal organic complex may be improved. Particularly, by being included with the polymer described in the present specification, an advantage of minimizing moisture or oxygen playing a fatal role in decreasing a lifetime of an organic light emitting device may also be provided in the device. In addition, when using the fluorine-based polymer including sulfonic acid or sulfonate described in the present specification, high work function, a working principle of a transition metal oxide, may be maintained, and an advantage of improving interfacial properties with the organic material layer, an upper layer, is provided.

The hole injection or transfer layer formed using the coating composition has work function of 5.5 eV or higher.

According to one embodiment, the hole injection or transfer layer formed using the coating composition has a thickness of 1 nm to 1,000 nm.

According to another embodiment, the hole injection or transfer layer formed using the coating composition is annealed. For example, the hole injection or transfer layer is annealed at a temperature of 150° C. to 250° C.

Figure 2:
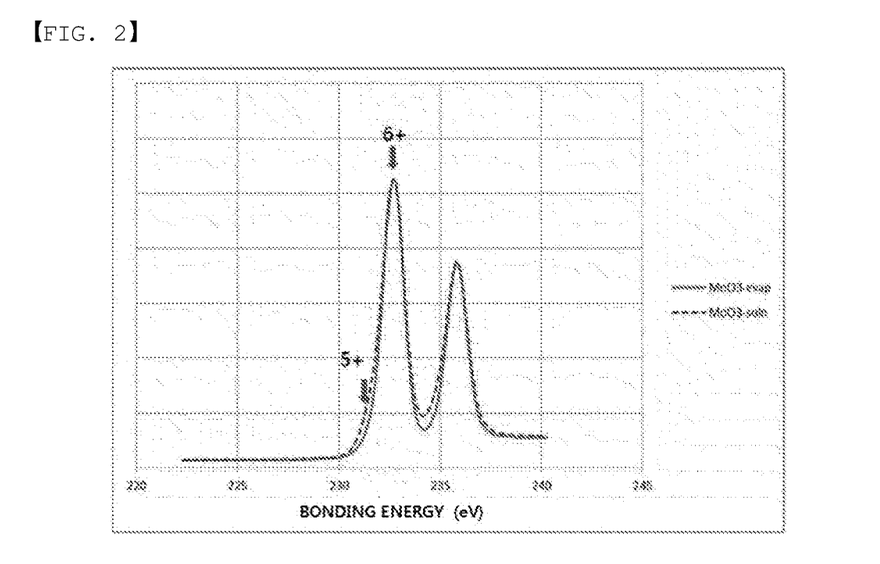
FIG. 2 shows an XPS result capable of identifying Mo—Mo bonds when forming a thin film using a coating composition according to one embodiment of the present disclosure.

According to another embodiment of the present application, the hole injection or transfer layer includes an M-O bond and an M-M bond, or includes $MO_3$ and $M_2O_5$, or forms an M-O—X bond with an interface of an adjoining electrode among the first electrode and the second electrode, and herein, M is a transition metal, and X is one of elements forming the adjoining electrode among the first electrode and the second electrode. For example, in $MoO_3$, an oxidation number of +5 is obtained in addition to an oxidation number of +6 when forming an Mo—Mo bond by a solution process, and as shown in FIG. 2, it is identified that Mo peaks of +5 oxidation number, a lower oxidation number, are detected when analyzing the thin film obtained through the solution process using XPS. Herein, the amount of Mo having an oxidation number of +5 is not particularly limited as long as it is greater than 0. As another embodiment, the hole injection or transfer layer adjoins the first electrode formed with ITO, and forms a M-O—In or M-O—Sn bond at an interface with the first electrode.

For example, adhesive strength is enhanced when forming an M-O—X bond as above between the electrode and the hole injection layer thin film, and mechanical strength of the hole injection layer itself may increase.

As for other constitutions of the organic light emitting diode, the descriptions provided above and constitutions known in the art may be applied.

The organic light emitting diode according to the present specification may be a top-emission type, a bottom-emission type or a dual-emission type depending on the materials used.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

Example 1

After washing an ITO-coated glass substrate consecutively with water and isopropanol, a solution obtained by mixing $MO_2(acac)_2$ and Nafion (following structural formula A) in a ratio of 9:1 and dissolving the result in ethylene glycol monomethyl ether was spin coated on the ITO-deposited base for seconds at 3000 rpm. The obtained thin film was heat treated for 15 minutes at 200° C. under oxygen atmosphere to form a very uniform hole injection layer having a thickness of 30 nm.

On the top of the hole injection layer, a hole transfer layer having a thickness of 400 Å was formed using a spin coating method by dissolving a hole transfer material represented by the following Chemical Formula B in toluene.

On the hole transfer layer, a light emitting layer having a thickness of 300 Å was formed by doping BD, a blue dopant, to BH, a blue fluorescent host, in a weight ratio of 95:5.

Subsequently, on the top of the light emitting layer, an electron transfer layer and an electron injection layer were formed by depositing a material of the following Chemical Formula C and then depositing LiF.

Finally, Al was deposited on the LiF layer to a thickness of 800 Å to manufacture an organic light emitting diode. Properties of this device are shown in Table 1.

Chemical Formula A

Chemical Formula B

Chemical Formula C

BH

BD

Example 2

A device was manufactured in the same manner as in Example 1 except that the thin film was treated under nitrogen atmosphere.

Example 3

A device was manufactured in the same manner as in Example 1 except that EW825 of 3M (following Chemical Formula D) was used instead of Nafion.

Chemical Formula D

Example 4

A device was manufactured in the same manner as in Example 1 except that the following Compound E (Mw=1,000,000) was used instead of Nafion. In the following Compound E, the ratio of n:m was 2:8.

Compound E

Example 5

A device was manufactured in the same manner as in Example 1 except that the following Compound F (Mw=500,000) was used instead of Nafion. In the following Compound F, the ratio of l:m was 1:9.

Compound F

Comparative Example 1

A device was manufactured in the same manner as in Example 1 except that the hole injection layer was formed using only $MoO_2(acac)_2$ without the additive. In this experiment, it was identified that a lifetime property of the device declined.

Comparative Example 2

A device was manufactured in the same manner as in Example 1 except that the hole injection layer was formed using only Nafion without using $MoO_2(acac)_2$. The layer formed using only Nafion without including an organic metal complex such as $MoO_2(acac)_2$ exhibited an insulating property. Accordingly, it was identified that a voltage property of the manufactured device declined, and an efficiency property and a lifetime property thereof declined as well.

Comparative Example 3

A device was manufactured in the same manner as in Example 1 except that polystyrene sulfonic acid (molecular weight: Mw=75,000) (following Chemical Formula G) was mixed instead of Nafion.

Chemical Formula G

In this experiment, it was identified that a voltage property declined and a lifetime property declined as well even with sulfonic acid.

Comparative Example 4

A device was manufactured in the same manner as in Example 1 except that polyvinylphenol was used instead of Nafion. In this experiment, it was identified that an efficiency property and a lifetime property declined.

Comparative Example 5

A device was manufactured in the same manner as in Example 1 except that Zonyl FSN-100 of DuPont (following Chemical Formula H, molecular weight=~950) was purchased from Aldrich and used instead of Nafion.

Chemical Formula H

In this experiment, improvements in the coating and the device properties were not obtained even though a material containing a fluorine group in large quantities was added.

Comparative Example 6

A device was manufactured in the same manner as in Example 1 except that dodecylamine, a monomer including an amine group, was added in a ratio of 9:1 instead of Nafion including a sulfonyl group. In this experiment, a phenomenon of a coating property being relatively non-uniform was observed, and a phenomenon of increasing a driving voltage was observed.

Driving voltage, efficiency and lifetime property of the devices manufactured in the examples and the comparative examples described above are shown in the following Table 1.

TABLE 1

|  | Voltage (V) | Efficiency (EQE) | LT80 |
|---|---|---|---|
| Example 1 | 4.45 | 5.05 | 10 |
| Example 2 | 4.30 | 4.95 | 13 |
| Example 3 | 4.71 | 4.32 | 11 |
| Example 4 | 4.73 | 4.5 | 7 |
| Example 5 | 4.81 | 4.53 | 7.5 |
| Comparative Example 1 | 4.32 | 4.74 | 5 |
| Comparative Example 2 | 16.32 | 3.78 | <0.1 |
| Comparative Example 3 | 6.51 | 4.38 | 1 |
| Comparative Example 4 | 4.83 | 4.08 | 1 |
| Comparative Example 5 | X | X | X |
| Comparative Example 6 | 6.98 | 4.46 | <1 |

The measurement values in Table 1 are results measured at mA/cm$^2$. LT80 representing a lifetime property means time taken for the luminance reaching 80% with respect to its initial luminance.

The invention claimed is:

1. A hole injection or transfer layer coating composition of an organic light emitting diode, the composition comprising:

an organic metal complex of a transition metal;

a polymer comprising a unit of the following Chemical Formula 1; and an organic solvent:

[Chemical Formula 1]

in Chemical Formula 1,

A is at least one selected from an aromatic hydrocarbon ring, a heteroring or a substituted or unsubstituted alkylene group wherein optionally at least one carbon atom of the alkylene group is replaced by O, S, C(=O), S(=O) or S(=O)$_2$;

$X_1$ is O or S, $X_2$ is $CR_5R_6$, O or S, n is an integer of 1 to 10, p is an integer of 1 to 10 and m is an integer of 0 to 10;

Y is $SO_3H$, $SO_3Li$, $SO_3Na$, $SO_3K$, $SO_3Rb$ or $SO_3Cs$; and $R_1$ to $R_6$ are each independently hydrogen, fluorine, an alkyl group or a fluoroalkyl group, and at least one of $R_1$ and $R_2$ is fluorine.

2. The hole injection or transfer layer coating composition of an organic light emitting diode of claim 1, wherein, in the organic metal complex of a transition metal, the transition metal is a transition metal of group 3 to group 11.

3. The hole injection or transfer layer coating composition of an organic light emitting diode of claim 1, wherein, in the organic metal complex of a transition metal, the transition metal is Mo, W, V, Re, Mn or Rh.

4. The hole injection or transfer layer coating composition of an organic light emitting diode of claim 1, wherein a content of the organic metal complex of a transition metal in the coating composition is from 0.01% by weight to 50% by weight.

5. The hole injection or transfer layer coating composition of an organic light emitting diode of claim 1, wherein the polymer comprising the unit of Chemical Formula 1 has a weight average molecular weight of 2,000 or greater.

6. The hole injection or transfer layer coating composition of an organic light emitting diode of claim 1, wherein, in A of Chemical Formula 1, the alkylene group is further substituted with fluorine.

7. The hole injection or transfer layer coating composition of an organic light emitting diode of claim 1, wherein Chemical Formula 1 is represented by the following Chemical Formula 1-1 or 1-2:

[Chemical Formula 1-1]

[Chemical Formula 1-2]

in Chemical Formulae 1-1 and 1-2, q, r, s and t are each independently an integer of 1 to 500, and the remaining substituents are the same as defined in Chemical Formula 1.

8. The hole injection or transfer layer coating composition of an organic light emitting diode of claim 1, wherein a content of the polymer is from 0.01% by weight to 50% by weight with respect to the whole coating composition.

9. The hole injection or transfer layer coating composition of an organic light emitting diode of claim 1, wherein the organic solvent comprises at least one of ether-based, alcohol-based, ketone-based or ester-based solvents.

10. The hole injection or transfer layer coating composition of an organic light emitting diode of claim 1, wherein the organic solvent comprises a solvent represented by the following Chemical Formula 5:

[Chemical Formula 5]

in Chemical Formula 5,
n is an integer of 1 to 20;
l and m are each or simultaneously an integer of 0 to 5; and
$R_1$, $R_2$, $R_3$ and $R_4$ are each or simultaneously a hydrogen atom, an alkyl group having 1 to 20 carbon atoms, an alkenyl group having 2 to 20 carbon atoms, an alkynyl group having 2 to 20 carbon atoms, an alkoxy group having 1 to 20 carbon atoms, an aryl group having 6 to 40 atoms, a heteroaryl group having 2 to 40 carbon atoms, or an ester group having 1 to 20 carbon atoms.

11. The hole injection or transfer layer coating composition of an organic light emitting diode of claim 1, wherein the organic solvent comprises at least one of ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2 propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600 or triethylene glycol.

12. A method for manufacturing an organic light emitting diode comprising:
preparing a substrate;
forming a first electrode on the substrate;
forming at least one organic material layer on the first electrode;
and forming a second electrode on the organic material layer,
and further comprising forming a hole injection or transfer layer between the first electrode and the organic material layer or between the second electrode and the organic material layer through a coating method using the coating composition of claim 1.

13. The method for manufacturing an organic light emitting diode of claim 12, wherein the hole injection or transfer layer formed using the coating composition has a thickness of 1 nm to 1,000 nm.

14. The method for manufacturing an organic light emitting diode of claim 12, further comprising annealing after the forming of a hole injection or transfer layer using the coating composition.

15. An organic light emitting diode comprising:
a first electrode;
a second electrode; and
at least one organic material layer provided between the first electrode and the second electrode,
and further comprising a hole injection or transfer layer provided between the first electrode and the organic material layer or between the second electrode and the organic material layer, and formed using the coating composition of claim 1.

16. An organic light emitting diode comprising:
a first electrode;
a second electrode; and
at least one organic material layer provided between the first electrode and the second electrode,
and further comprising a hole injection or transfer layer provided between the first electrode and the organic material layer or between the second electrode and the organic material layer, and comprising a transition metal oxide and a polymer comprising a unit of the following Chemical Formula 1:

[Chemical Formula 1]

in Chemical Formula 1,

A is at least one selected from an aromatic hydrocarbon ring, a heteroring or a substituted or unsubstituted alkylene group wherein optionally at least one carbon atom of the alkylene group is replaced by O, S, C(=O), S(=O) or S(=O)$_2$;

$X_1$ is O or S, $X_2$ is $CR_5R_6$, O or S, n is an integer of 1 to 10, p is an integer of 1 to 10 and m is an integer of 0 to 10;

Y is $SO_3H$, $SO_3Li$, $SO_3Na$, $SO_3K$, $SO_3Rb$ or $SO_3Cs$; and $R_1$ to $R_6$ are each independently hydrogen, fluorine, an alkyl group or a fluoroalkyl group, and at least one of $R_1$ and $R_2$ is fluorine.

17. The hole injection or transfer layer coating composition of an organic light emitting diode of claim 1, wherein, A of Chemical Formula 1 is at least one selected from an aromatic hydrocarbon ring having 6 to 60 carbon atoms, a heteroring having 2 to 60 carbon atoms, a linear or branched alkylene group unsubstituted or substituted with a halogen group, wherein optionally at least one carbon atom of the alkylene group is replaced by O, S, C(=O), S(=O) or S(=O)$_2$.

18. The method for manufacturing an organic light emitting diode of claim 12, wherein the coating method is spin coating, ink jetting or nozzle printing.

19. The method for manufacturing an organic light emitting diode of claim 14, wherein the annealing is carried out at a temperature of 150° C. to 250° C.

20. The organic light emitting diode of claim 16, wherein the at least one organic material layer is formed using a solution process.

* * * * *